United States Patent [19]

Matsumoto et al.

[11] Patent Number: 5,137,866

[45] Date of Patent: Aug. 11, 1992

[54] METHOD FOR PRODUCING MOLDED ARTICLE OF CERAMIC OXIDE SUPERCONDUCTOR

[75] Inventors: Yasuyo Matsumoto; Hajime Hitotsuyanagi, both of Osaka; Michihisa Kyoto, Yokohama; Masashi Onishi, Yokohama; Yuichi Masuda, Yokohama, all of Japan

[73] Assignee: Sumitomo Electric Industries, Ltd., Osaka, Japan

[21] Appl. No.: 557,005

[22] Filed: Jul. 25, 1990

Related U.S. Application Data

[63] Continuation of Ser. No. 172,889, Mar. 25, 1988, abandoned.

[30] Foreign Application Priority Data

Mar. 26, 1987 [JP] Japan ................................ 62-73287
Mar. 26, 1987 [JP] Japan ................................ 62-73288
Dec. 14, 1987 [JP] Japan ................................ 62-315680

[51] Int. Cl.$^5$ ............................................. H01L 39/12
[52] U.S. Cl. ............................................. 505/1; 264/22; 264/56; 264/61; 505/725
[58] Field of Search .................... 505/1, 725, 739, 778, 505/779, 780; 264/56, 332, 22, 61

[56] References Cited

U.S. PATENT DOCUMENTS 4,729,801  3/1988  Togano et al. ................... 148/133
4,762,754  8/1988  Nellis et al. ..................... 428/552

FOREIGN PATENT DOCUMENTS 60-239378  11/1985  Japan ................................ 264/25

OTHER PUBLICATIONS

Wenger et al, "Observation of Superconducting Current in LA-BA-CA-O at 280K" (Feb. 1987).
K. Atobe et al., "Low-temperature neutron irradiation effects on superconducting Y-Ba-Cu oxides", *Physical Review B*, vol. 36, No. 13, pp. 7194-7196, Nov. 1987.
J. G. Bednorz et al., "Possible High $T_c$ Superconductivity in the Ba-La-Cu-O Systems", *Z. Physicians B-Condensed Matter*, vol. 64, pp. 189-193 (1986).
Wu et al., "Effects of Powder Preparation and Sintering on the High Temperature Superconducting Y-Ba-Cu-O System," *High Temperature Superconductors*, ed Gubser, 1987 MRS Spring Mtg., pp. 197-200.
Dagani, "Superconductivity: A Revolution in Electricity is Taking Shape," C&EN, May 11, 1987, pp. 7-16.

*Primary Examiner*—James Lowe
*Assistant Examiner*—Christopher A. Fiorilla
*Attorney, Agent, or Firm*—Wegner, Cantor, Mueller & Player

[57] ABSTRACT

A molded article of ceramic oxide superconductor having an increased critical current density is produced by a method including sintering a powdery mixture of oxides and/or carbonates of elements which constitute the ceramic oxide superconductor to obtain a molded article, or melting the sintered ceramic oxide superconductor and molding the superconductor melt to obtain a molded article, wherein the powdery mixture and/or the molded article is irradiated.

2 Claims, 1 Drawing Sheet

METHOD FOR PRODUCING MOLDED ARTICLE OF CERAMIC OXIDE SUPERCONDUCTOR

This application is a continuation of Ser. No. 07/172,889 filed Mar. 25, 1988 and now abandoned.

BACKGROUND OF THE INVENTION

1. Field of the Invention

The present invention relates to a method for producing a molded article of a ceramic oxide superconductor.

2. Description of Related Art

A superconductor exhibits complete diamagnetism under superconductive conditions and has no potential difference therein in spite of flow of stationary current therein. By using this characteristic of the superconductor, many applications of superconductors as mediums for electric current have been proposed.

Application fields of superconductors include versatile technical fields such as an electric power field (e.g. MHD power generation, power transmission, power storage, etc.), a motive power field (e.g. linear motor (magnetic letivation) trains, electromagnetic propulsion ships, etc.), and a measuring field in which the superconductor is used as a highly sensitive sensor for a magnetic field, a microwave, radiation and the like (e.g. NMR, therapy using $\pi$-meson, high energy physical experiment apparatus, etc.).

In addition, in the electronic components including a Josephson element, the superconductor is expected to provide an element which can not only decrease consumed power but also work at a very high speed.

The superconductive phenomenon has been found in specific metals or organic compounds at extremely low temperatures. Namely, among classical superconductors, $Nb_3Ge$ is said to have the highest critical temperature Tc for superconductivity of 23.2° K and this temperature has been considered as the upper limit of Tc for a long time.

Hitherto, to realize the superconductive phenomenon, a superconductor should be cooled to a temperature lower than Tc with liquid helium which has a boiling point of 4.2° K However, the use of liquid helium greatly increases technical burden and cost because of necessity of a cooling system including an apparatus for liquefying helium, which prevents practical application of the superconductor.

Recently, it was reported that a sintered material comprising oxides of elements of IIA or IIIB group of the periodic table can act as a superconductor at a high critical temperature and is expected to accelerate practical application of superconductor technology. From already available reports, compound oxides having a crystal structure similar to the perovskite crystal structure such as $(La,Ba)_2CuO_4$ or $(La,Sr)_2CuO_4$ are known as superconductors having high Tc. These compound oxides have a Tc of 30 to 50° K, which is far higher than that of the classical superconductors. In addition, a Ba-Y-Cu type superconductor is reported to have Tc higher than the liquid nitrogen temperature.

Hitherto, the ceramic oxide superconductor is processed into a molded article by substantially the same method as adopted for molding non-superconductive oxide ceramic oxides. For example, powdery raw material oxides are pressed and then sintered to produce a molded article. If necessary, the pressed powder is pre-sintered before sintering.

The ceramic oxide superconductor comprising a La-Ba-Cu base oxide, La-Sr-Cu base oxide, Ba-Y-Cu base oxide or the like has been developed. When a molded article of such ceramic oxide superconductor is produced from a powdery raw material by the conventional method as described above, it is difficult to provide a crystalline structure of the ceramic oxide superconductor and to increase a size of crystal grain boundary, so that the produced article of ceramic oxide superconductor has a relatively small critical current density.

In addition, since the molded article of ceramic oxide superconductor produced by sintering has a smaller degree of shaping freedom, it is difficult to produce a wire from the ceramic oxide superconductor. In the production of a wire, the ceramic oxide superconductor is processed in the form of a thin wire having a diameter of 1 mm or less and extended to a length of several meters. Further, the wire cross section should have a suitable shape such as a pipe, etc.

For producing a molded article, there are known several methods including a method comprising melting a sintered ceramic oxide superconductor and molding the superconductor melt to form an article having a desired shape, and a method comprising covering the sintered ceramic oxide superconductor with a metal sheath to stabilize the superconductor and then wiring the sheathed superconductor.

In such conventional methods, the once sintered ceramic oxide superconductor is melt or thermally treated at high temperature for a long period of time. Therefore, the superconductive phase created in the ceramic oxide superconductor tends to be modified or lost.

It is proposed to anneal the wire of sintered ceramic oxide superconductor at a temperature of about 950° C. to recreate the superconductive phase in the wire. However, the molded article tends to be broken during annealing. Further, since some of the elements such as copper and oxide are dissipated during annealing, the superconductor cannot keep its homogeneous composition.

Because of the above problems found in the conventional processing methods, it seems to be hardly possible to stably process the ceramic oxide superconductor and to produce a molded article of ceramic oxide superconductor having a desired shape.

SUMMARY OF THE INVENTION

One object of the present invention is to provide a method for producing a molded article of ceramic oxide superconductor having a larger critical current density than a ceramic oxide superconductor processed by the conventional methods.

Another object of the present invention is to provide a method for producing a molded article of ceramic oxide superconductor, by which the ceramic oxide superconductor is stably processed and a molded article having a desired shape is produced.

Accordingly, the present invention provides a method for producing a molded article of ceramic oxide superconductor comprising sintering a powdery mixture of oxides and/or carbonates of elements which constitute the ceramic oxide superconductor to obtain a molded article or comprising melting the sintered ceramic oxide superconductor and molding the superconductor melt to obtain a molded article, wherein the powdery mixture and/or the molded article is irradiated. Thus, the method of the present invention is characterized in that the ceramic oxide superconductor is irradiated before or after sintering, or that a molded article of ceramic oxide superconductor made from its melt is irradiated by electron beam, gamma-ray, X-ray, neutron beam and the like.

DETAILED DESCRIPTION OF THE INVENTION

Figure 1A:
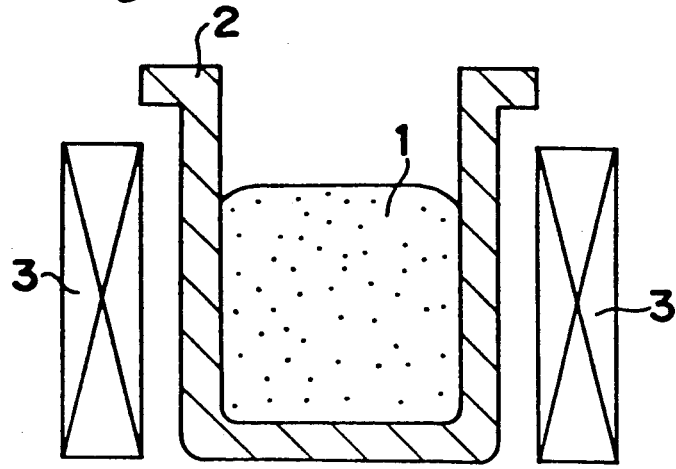
FIGS. 1A and 1B schematically show a method for producing a rod of sintered ceramic oxide superconductor, and FIG. 2 schematically shows a method for wiring a superconductor melt form the sintered rod.

It is known that the ceramic oxide superconductor exhibits superconductive behavior at a temperature equal to or lower than its critical temperature. The higher critical temperature, the better. However, in view of practical applications, it is also important for the ceramic oxide superconductor to generate a strong magnetic field. To this end, the superconductor is required to have large critical magnetic field and large critical current density. While the critical temperature and the critical magnetic field are inherent to a specific ceramic oxide superconductor, the critical current density is greatly influenced by a crystalline structure of the ceramic oxide superconductor. When the ceramic oxide superconductor has a larger number of dislocations or a larger grain boundary, it has a larger critical current density.

According to the present invention, the number of dislocations or the size of grain boundary can be increased by irradiation so that the critical current density of the ceramic oxide superconductor is increased.

Preferably, the ceramic oxide superconductor is made from (1) at least one compound selected from oxides and carbonates of the elements of IA, IIA and IIIB groups of the periodic table and (2) at least one compound selected from oxides of the elements of IB, IIB and IIIA groups of the periodic table. The raw material oxides are reacted in a solid phase by, for example, sintering. More preferably, the ceramic oxide superconductor contains at least two compounds selected from oxides and carbonates of the IA, IIA and IIIB groups. For example, the La-Ba-Cu base oxides, La-Sr-Cu base oxides and Ba-Y-Cu base oxides are known. Among one having a perovskite type crystalline structure has a composition of the formula:

$$(M^1{}_{1-x}M^2{}_x)_2M^3O_{4-y} \qquad (I)$$

wherein $M^1$ and $M^2$ are the same or different are and each at least one element selected from the IA, IIA and IIIA group elements, $M^3$ is at least one element selected from the IB, IIB and IIIA group elements, x is a number not smaller than 0 and smaller than 1 ($0 \leq x < 1$), and y is a number larger than 0 and smaller than 4 ($0 < y < 4$).

In one of the preferred embodiments, the molded article of ceramic oxide superconductor is produced by sintering under the same conditions as used in the conventional methods. Although the powdery raw materials may be irradiated, preferably a presintered material or the final molded article of ceramic oxide superconductor is irradiated.

Another preferred embodiment of the present invention in which the sintered ceramic oxide superconductor is melted and then processed in the form of a wire will be illustrated by making reference to the accompanying drawings.

As raw materials, suitable metal oxides and/or carbonates are weighed and mixed in a desired ratio and dried followed by pressing and presintering. The presintered material is ground and then press molded in the form of a desired shape, for example, in pellets, which is sintered to obtain a sintered material of ceramic oxide superconductor.

Figure 2:
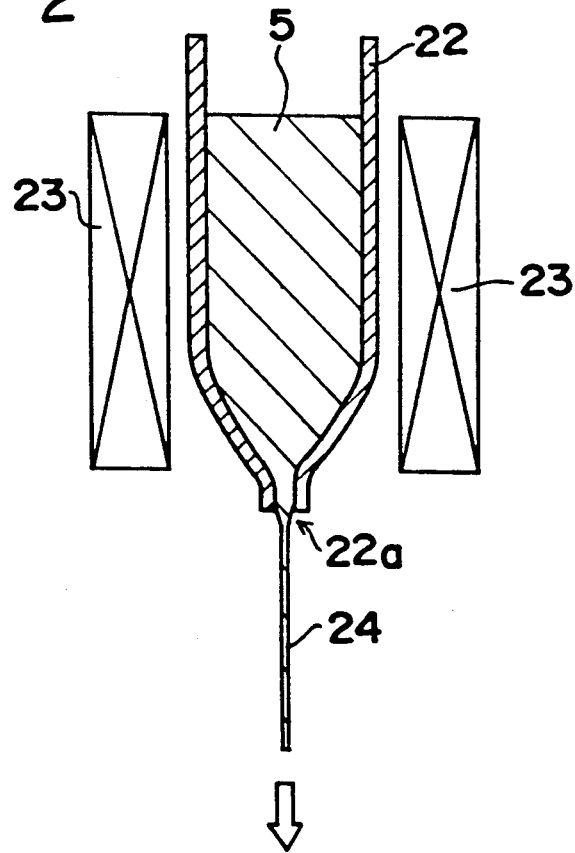

The sintered material 1 is again ground, charged in a carbon made crucible 2 as shown in FIG. 1A and heated and melted by a heater 3 surrounding the crucible 2. The melting temperature depends on the kind of ceramic oxide superconductor and is usually about 1,000° C. or higher. Thereafter, the superconductor melt is poured in an iron made mold 4 having a gold liner 40 shown in FIG. 2B to produce a cylindrical rod 5 of ceramic oxide superconductor Then, the rod 5 is drawn by a wire draw bench shown in FIG. 2 to form a wire. Namely, the rod 5 contained in a container 22 having a nozzle 22a at its bottom end and heated by a heater 23 surrounding the container 23 in an atmosphere of inert gas such as nitrogen to a temperature higher than a melting point of the ceramic oxide superconductor. Then the superconductor melt is pressurized from its upper surface. Thereby, the melt is extruded from the nozzle 22a to obtain a wire having a diameter of, for example, 0.2 mm. Thereafter, the wire is irradiated. Preferably, the total exposure is at least 87 Mrad.

PREFERRED EMBODIMENTS OF THE INVENTION

The present invention will be illustrated by following Examples.

EXAMPLE 1

A mixture of lanthanum oxide powder, strontium carbonate powder and copper oxide powder in such a ratio that an atomic ratio of La:Sr:Cu in a produced ceramic oxide superconductor would be 1.6:0.4:1.0 was press molded to form pellets each having a thickness of 1 mm. The pellets were then irradiated by electron beam. By taking multiple scattering caused by reaction between the electrons and nuclei into consideration, the pellets were irradiated with an electron beam accelerated at 6 MeV and 1 mA to a total dose of 6 Mrads.

The irradiated pellets were presintered by heating them at 900° C. for 12 hours three times. The presintered pellets were sintered at 1,100° C. for 2 hours to prepare a sample piece to be examined for the superconductive properties.

The sample had a critical temperature of 45° K and critical current density of 1,500 A/cm².

COMPARATIVE EXAMPLE 1

In the same manner as in Example 1 except that the pellets were not irradiated, the sample piece was produced. It had a critical temperature of 38° K and critical current density of 1,000 A/cm2.

EXAMPLE 2

A mixture of lanthanum oxide powder, strontium carbonate powder and copper oxide powder in such a ratio that an atomic ratio of La:Sr:Cu in a produced ceramic oxide superconductor would be 1.8:0.2:1 was press molded to form pellets each having a thickness of 1 mm. Then, the pellets were presintered by heating them at 900° C. for 12 hours three times. The presintered pellets were sintered at 1,100° C. for 2 hours, The pellets were then irradiated by electron beam. By taking multiple scattering caused by reaction between the electrons and nuclei into consideration, the pellets were irradiated with an electron beam accelerated at 3 MeV and 1 mA to a total dose of 3 Mrads to prepare a sample piece to be examined for the superconductive properties.

The sample had a critical temperature of 40 K and critical current density of 2,500 A/cm2.

COMPARATIVE EXAMPLE 2

In the same manner as in Example 2 except that the sintered pellets were not irradiated, the sample piece was produced. It had a critical temperature of 35° K and critical current density of 1,200 A/cm2.

EXAMPLE 3

BaO, $Y_2O_3$, CuO, $La_2O_3$ and $SrO_2$ were weighed and mixed in such a ratio that an atomic ratio of Ba:Y:Cu:La:Sr would be 1:2:4:1.8:0.2, dried and press molded. Then, the molded material was presintered at 900° C. for 12 hours three times followed by grinding and press molding to form pellets each having a thickness of 1 mm. The pellets were then sintered at 1,100° C. for 2 hours.

Figure 1B:
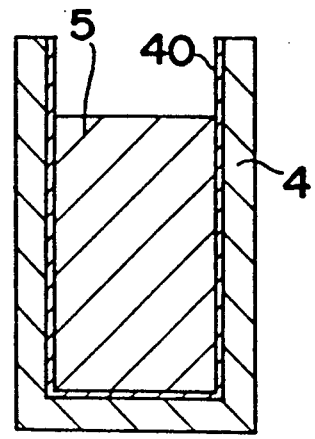

The sintered pellets were melted in the carbon made crucible of FIG. 1A at 1,300° C. The melt was poured in the iron made mold of FIG. 1B to form a rod 5 of ceramic oxide superconductor. Then, the rod was drawn by the wire draw bench of FIG. 2. The rod 5 contained in the container 22 was heated at 1,330° C. in the nitrogen atmosphere and pressurized under 100 atm from its upper surface. Thereby, the rod was fluidized and extruded from the nozzle 22a to obtain a wire having an outer diameter of 0.2 mm.

The produced wire was then irradiated by neutron beam for about 12 hours to a total dose of 87 Mrads.

The crystalline structure of the irradiated wire was analyzed by powder X-ray diffraction to find that the ceramic oxide superconductor had a $K_2NiF_4$ crystalline structure. The irradiated ceramic oxide superconductor had superconductive properties at 77° K (liquid nitrogen temperature).

The superconductor irradiated by neutron beam may contain radioactive species which are dangerous to human beings and should be very carefully handled.

EXAMPLE 4

In the same manner as in Example 3 but irradiating the wire with gamma-ray in place of neutron beam, a wire of irradiated ceramic oxide superconductor was produced. The powder X-ray diffraction of the wire revealed that the ceramic oxide superconductor had a $K_2NiF_4$ crystalline structure. The irradiated ceramic oxide superconductor had the superconductive properties at 77° K (liquid nitrogen temperature). In this case, no radioactive species was generated.

EXAMPLE 5

In the same manner as in Example 4 but irradiating the wire heated at 400° C. with gamma-ray to a total dose of 87 Mrads, a wire of irradiated ceramic oxide superconductor was produced. In the superconductive state, in comparison to the wire of Example 3, several times the amount of current could be passed through the wire of this Example.

In the above Examples, the wire was produced, but the ceramic oxide superconductor having any shape such as a pipe, a plate and a tape can be produced.

As explained above, according to the method of the present invention, a ceramic oxide superconductor having a larger critical current density is produced. Therefore, the ceramic oxide superconductor produced by the present invention will be suitable for generating a large magnetic field which is required by a nuclear fusion reactor, a large scale particle accelerator, a magnetic levitation train and the like.

When the melt molded article of ceramic oxide superconductor is irradiated to impart superconductive properties, the ceramic oxide superconductor can be processed in any suitable shape. Further, the composition of the ceramic oxide superconductor is stabilized and made more dense.

What is claimed is:

1. A method for producing molded article of ceramic oxide superconductor, the ceramic oxide superconductor being a copper oxide superconductor containing strontium, barium, lanthanum and yttrium along with copper and oxygen, the method comprising pressing and sintering a powdery mixture of oxides and/or carbonates of elements which constitute the ceramic oxide superconductor to obtain a molded article, the sintering taking place at a temperature of about 1100° C., the atomic ratio of Ba:Y:Cu:La:Sr in the powdery mixture being 1:2:4:1.8:0.2, wherein the powdery mixture and/or the molded article is irradiated with electrons, gamma rays, X-rays or neutrons, the irradiation dose being 3-87 Mrad, to increase the critical current density of the molded article.

2. A method for producing a molded article of ceramic oxide superconductor, the ceramic oxide superconductor being a copper oxide superconductor containing strontium, barium, lanthanum and yttrium along with copper and oxygen, the method comprising sintering a powdery mixture of oxides and/or carbonates of elements which constitute the ceramic oxide superconductor at a temperature of about 1100° C. the atomic ratio of Ba:Y:Cu:La:Sr in the powdery mixture being 1:2:4:1.8:0.2, and then melting the sintered ceramic oxide superconductor and molding the superconductor melt to obtain a molded article, wherein the powdery mixture and/or the molded article is irradiated with electrons, gamma rays, X-rays or neutrons, the irradiation dose being 3-87 Mrad, to increase the critical current density of the molded article.

* * * * *